(12) United States Patent
Qian et al.

(10) Patent No.: US 11,691,763 B2
(45) Date of Patent: Jul. 4, 2023

(54) PRESSURE MEASURING DEVICE FOR A SCALE MODEL FOR ELASTIC SIMILAR STRUCTURE OF A WING IN A LARGE PLANE

(71) Applicant: Dalian University of Technology, Liaoning (CN)

(72) Inventors: Wei Qian, Liaoning (CN); Shaojie Ge, Liaoning (CN); Xing Li, Liaoning (CN); Xiangyan Chen, Liaoning (CN)

(73) Assignee: Dalian University of Technology, Dalian (CN)

( * ) Notice: Subject to any disclaimer, the term of this patent is extended or adjusted under 35 U.S.C. 154(b) by 314 days.

(21) Appl. No.: 17/061,395

(22) Filed: Oct. 1, 2020

(65) Prior Publication Data

US 2021/0107687 A1    Apr. 15, 2021

(30) Foreign Application Priority Data

Oct. 11, 2019    (CN) .......................... 201910960640.X

(51) Int. Cl.
| | |
|---|---|
| *B64F 5/60* | (2017.01) |
| *G01M 9/06* | (2006.01) |
| *G06F 30/10* | (2020.01) |
| *B64C 3/26* | (2006.01) |
| *B33Y 80/00* | (2015.01) |

(52) U.S. Cl.
CPC .................. *B64F 5/60* (2017.01); *B64C 3/26* (2013.01); *G06F 30/10* (2020.01); *B33Y 80/00* (2014.12)

(58) Field of Classification Search
CPC . B64F 5/60; G01M 9/06; G01M 9/062; G01F 1/46
See application file for complete search history.

(56) References Cited

U.S. PATENT DOCUMENTS

| | | | | |
|---|---|---|---|---|
| 4,688,422 A | * | 8/1987 | Wood | G01L 19/0015 73/756 |
| 5,483,839 A | * | 1/1996 | Meunier | G01P 5/165 73/861.66 |
| 5,929,339 A | * | 7/1999 | Moore | G01L 15/00 73/756 |
| 7,114,387 B2 | * | 10/2006 | Omotani | G01M 9/065 73/170.02 |
| 9,841,340 B1 | * | 12/2017 | Harthan | G01L 19/0038 |

(Continued)

*Primary Examiner* — Moshe Wilensky
*Assistant Examiner* — Kyle A Cook
(74) *Attorney, Agent, or Firm* — Ray Quinney & Nebeker P.C.; Paul N. Taylor

(57) ABSTRACT

A pressure measuring device for a scale model for elastic similar structure of a wing in a large transport plane adopts a bracket for pressure measuring steel pipes formed by 3D printing, shapes of an upper surface and an lower surface of the bracket are completely the same as local airfoile profiles of a skin at required pressure measuring positions, and the upper surface and the lower surface of the bracket are bonded to the skin and wing beams; a pressure measuring hose is connected with the pressure measuring steel pipe, and the pressure measuring steel pipe is embedded into the bracket and fixed to it; the upper surface and the lower surface of the bracket are provided with semi-cylindrical convex structures; and the pressure measuring steel pipe extends out of the pressure measuring hole in the surface of the skin for pressure measuring steel pipe in the bracket.

3 Claims, 2 Drawing Sheets

(56) References Cited

U.S. PATENT DOCUMENTS

| | | | |
|---|---|---|---|
| 2002/0088276 A1* | 7/2002 | Omotani | G01M 9/08 |
| | | | 73/147 |
| 2006/0179933 A1* | 8/2006 | Cochran | G01L 15/00 |
| | | | 73/170.02 |
| 2007/0107508 A1* | 5/2007 | Tavares | G01L 15/00 |
| | | | 73/170.01 |
| 2007/0107509 A1* | 5/2007 | Romero Checa | G01L 15/00 |
| | | | 73/170.01 |
| 2008/0223141 A1* | 9/2008 | Schmid | G01L 15/00 |
| | | | 73/721 |
| 2020/0331631 A1* | 10/2020 | DeGroff | G01P 5/165 |

* cited by examiner

PRESSURE MEASURING DEVICE FOR A SCALE MODEL FOR ELASTIC SIMILAR STRUCTURE OF A WING IN A LARGE PLANE

CROSS REFERENCE TO RELATED APPLICATION

This application claims the priority of Chinese Patent Application No. 201910960640.X entitled "Pressure Measuring Device for a Scale Model for Elastic Similar Structure of a Wing in a Large Transport Plane" filed with the Chinese Patent Office on Oct. 11, 2019, which is incorporated herein by reference in its entirety.

TECHNICAL FIELD

The disclosure relates to a pressure measuring device for a scale model for elastic similar structure of a wing in a large transport plane, and belongs to a technical field of wind tunnel tests.

BACKGROUND ART

In a static aeroelastic wind tunnel test, a model is generally subjected to measurement of a steady pressure distribution. The pressure measuring result can be used for calibration of a calculation method and used as a reference or basis for improving a calculation method. A reasonable and effective pressure measuring system for wind tunnel test model is an important basis for obtaining reliable research data. In order to ensure a validity of the pressure measuring result, a pipe axis of a pressure measuring pipe used in the wind tunnel test model must be strictly perpendicular to a skin surface, and an offset angle should be within plus or minus 1 degree, which is difficult to realize in actually manufacturing the model. And a scale model for elastic similar structure of the wing generally has small stiffness and large deformation, and a piezometer tube cannot be directly installed thereon.

SUMMARY

The embodiments aim to provide a pressure measuring device for a scale model for elastic similar structure of a wing in a large transport plane, the pressure measuring device should be simple to install, has a relatively small mass and stiffness, and can realize a required perpendicularity between a pipe axis of a piezometer tube and a tangent plane of a skin surface, and thus accuracy of pressure measurement results in the wind tunnel test is ensured.

A technical scheme adopted by the disclosure for solving the problems in the prior art is as follows: the pressure measuring device for a scale model for elastic similar structure of a wing in a large transport plane, including a bracket for pressure measuring steel pipes, pressure measuring hoses, holding blocks, pressure measuring steel pipes, wing beams and skin, an upper and a lower surface of the bracket for pressure measuring steel pipes are attached to the skin and are bonded to the skin and the wing beams by resin adhesive, and the pressure measuring steel pipe is connected to the pressure measuring hose, the pressure measuring steel pipe is embedded into a hole for pressure measuring steel pipe in the bracket for pressure measuring steel pipes, and the pressure measuring steel pipe is fixed by the holding block, and the pressure measuring steel pipe extends out of the skin.

The bracket for pressure measuring steel pipes is provided with pipe grooves for pressure measuring steel pipes for placing L-shaped pressure measuring steel pipes at required pressure measuring positions, and notches for bracket for placing the holding blocks are formed at pipe grooves for pressure measuring steel pipes in a middle of the bracket for pressure measuring steel pipes; the upper surface and the lower surface of the bracket for pressure measuring steel pipes are provided with semi-cylindrical convex structures at the required pressure measuring positions, a height of the semi-cylindrical convex structure is the same as a thickness of the adjacent skin, and an inner diameter of the semi-cylindrical convex structure is equal to an outer diameter of the pressure measuring steel pipe, and the outer diameter is larger than the inner diameter by 1 mm; an outer wall of the bracket for pressure measuring steel pipes is a thin-walled structure with a thickness of 1 mm, an inner part of the bracket for pressure measuring steel pipes is supported by a truss structure, and a plurality of through holes are arranged in a middle part of the bracket for pressure measuring steel pipes to facilitate laying of pressure measuring hoses in the wing; and an error of perpendicularity between an axis of the pressure measuring steel pipe and the tangent plane of the skin surface is smaller than 1.0 degree.

The holding block is arranged in the notch for bracket and is in contact with an outer circumferential surface of the pressure measuring steel pipe.

The bracket for pressure measuring steel pipes and the holding blocks are made of photosensitive resin and are integrally formed by 3D printing.

The embodiments has the advantages that the devices in the embodiments are easy to install, and light in weight, without bringing obviously additional mass and stiffness to the model; the bracket for pressure measuring steel pipes is integrally formed by 3D printing, thus a processing method thereof is simple and convenient; shapes of the upper surface and the lower surface of the bracket for pressure measuring steel pipes are the same as local airfoil profiles of the skin at corresponding sites, the bracket for pressure measuring steel pipes and the skin can realize complete fit to each other, and further realize a required perpendicularity between the pipe axis of the pressure measuring steel pipe and the tangent plane of the skin surface, ensuring the accuracy of pressure measurement results in the wind tunnel test. The device can realize simultaneous pressure measuring of the upper surface and the lower surface of the skin of the model.

Figure 1:
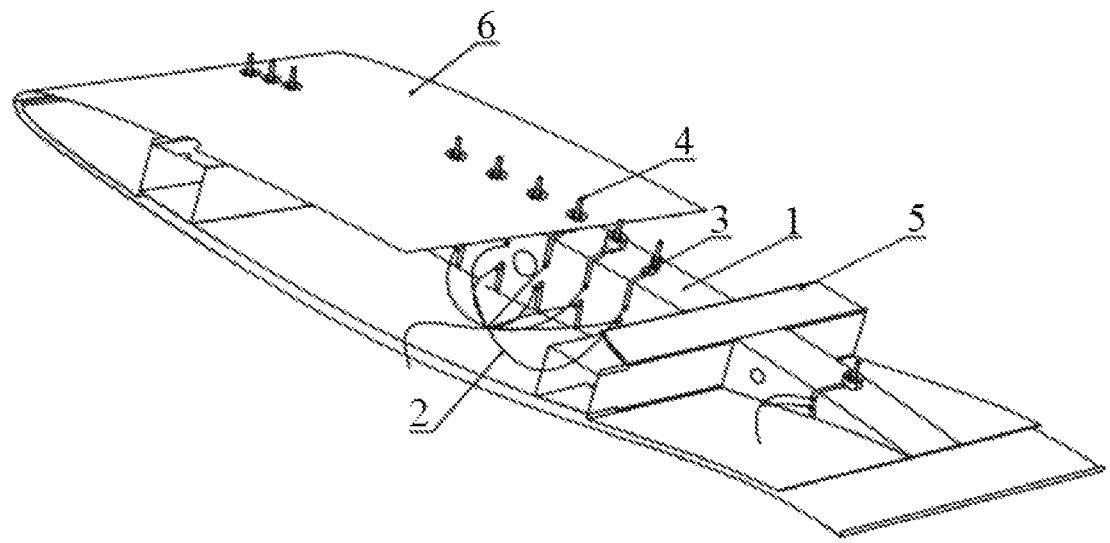
FIG. 1 is a schematic structural diagram of a pressure measuring device for a scale model for elastic similar structure of a wing in a large transport plane.

List of reference numerals in the figure: 1-*a* bracket for pressure measuring steel pipes, 1*a*-*a* thin-walled structure, 1*b*-*a* truss structure, 1*c*-*a* semi-cylindrical convex structure, 1*d*-*a* pipe groove for pressure measuring steel pipe, 1*e*-*a* through hole, 1*f*-*a* notch for bracket, 2-*a* pressure measuring hose, 3-*a* holding block, 4-*a* pressure measuring steel pipe, 5-*a* wing beam, 6-skin.

DETAILED DESCRIPTION OF THE EMBODIMENTS

Structures of the embodiments are further described below with reference to the accompanying drawings.

Figure 2:
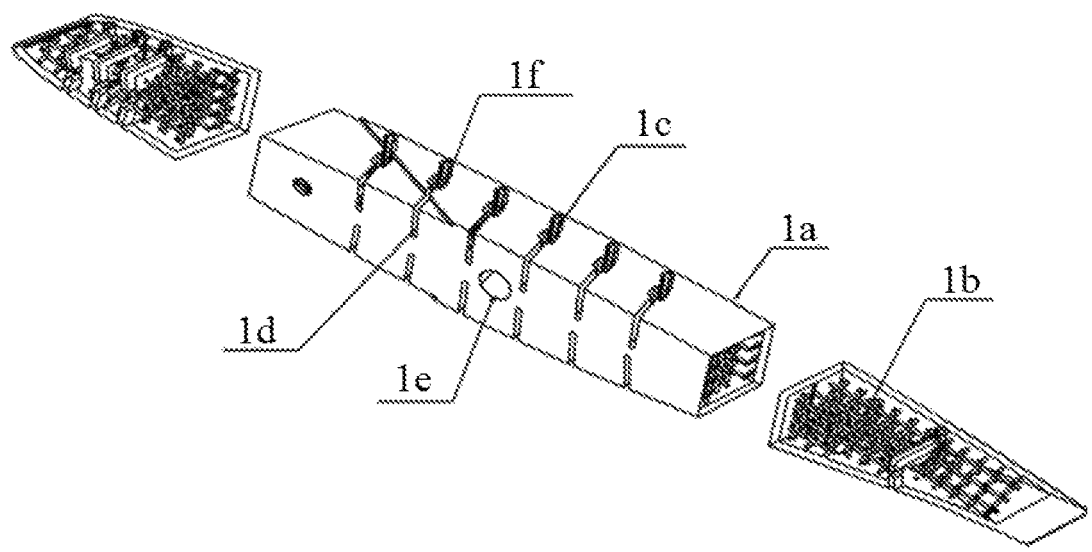
FIG. 2 is a schematic view of a structure of a bracket for pressure measuring steel pipes.
Figure 3:
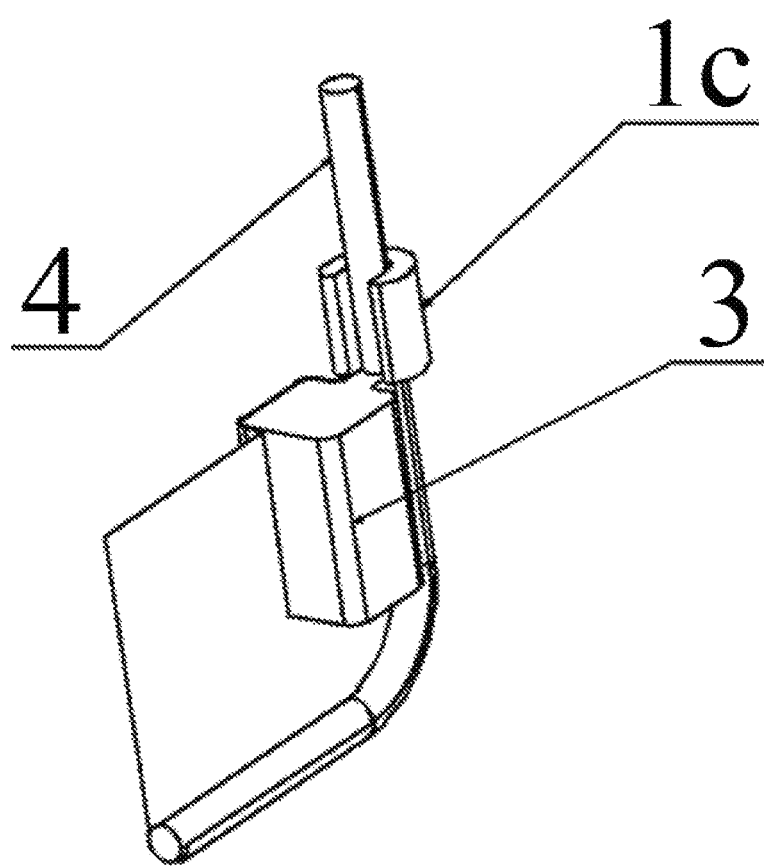
FIG. 3 is a structural view of a pressure measuring steel pipe fixed by a holding block.

FIGS. 1, 2 and 3 show structural schematic diagrams of the pressure measuring device for a scale model for elastic similar structure of a wing in a large transport plane. In the figures, this pressure measuring device for a scale model for elastic similar structure of a wing in a large transport plane includes a bracket for pressure measuring steel pipes 1, pressure measuring hoses 2, holding blocks 3, pressure measuring steel pipes 4, wing beams 5 and skin 6, wherein an upper surface and a lower surface of the bracket for pressure measuring steel pipes 1 are attached to the skin 6 and are bonded to the skin 6 and the wing beams 5 by resin adhesive, the pressure measuring steel pipe 4 is connected with the pressure measuring hose 2, the pressure measuring steel pipe 4 is embedded into a pipe groove for pressure measuring steel pipe 1d in the bracket for pressure measuring steel pipes 1, and the pressure measuring steel pipes 4 are fixed by the holding blocks 3, and the pressure measuring steel pipes 4 extend out of the skin 6.

The bracket for pressure measuring steel pipes 1 is provided with the pipe grooves for pressure measuring steel pipes 1d for placing L-shaped pressure measuring steel pipes 4 therein at required pressure measuring positions, and notches for bracket if for placing the holding blocks 3 are formed at the pipes grooves for pressure measuring steel pipes 1d in a middle of the bracket for pressure measuring steel pipes 1. The upper surface and the lower surface of the bracket for pressure measuring steel pipes 1 are provided with semi-cylindrical convex structures 1c at the required pressure measuring positions, a height of the semi-cylindrical convex structure 1c is the same as a thickness of the adjacent skin 6, and an inner diameter of the semi-cylindrical convex structure 1c is equal to an outer diameter of the pressure measuring steel pipe 4, and the outer diameter is larger than the inner diameter by 1 mm. An outer wall of the bracket of pressure measuring steel pipes 1 is a thin-walled structure 1a with a thickness of 1 mm, an inner part of the bracket for pressure measuring steel pipes 1 is supported by a truss structure 1b, and a plurality of through holes 1e are arranged in a middle part of the bracket for pressure measuring steel pipes 1 to facilitate laying of the pressure measuring hoses 2 in the wing. an error of perpendicularity between an axis of the pressure measuring steel pipe 4 and a tangent plane of a skin surface 6 is smaller than 1.0 degree.

The holding block 3 is arranged in the notch for bracket if and is in contact with an outer circumferential surface of the pressure measuring steel pipe 4.

The embodiments of the pressure measuring device for a scale model for elastic similar structure of a wing in a large transport plane in the disclosure are as follows. A bracket for pressure measuring steel pipes is designed, wherein the outer wall of the bracket for pressure measuring steel pipes is of a thin-walled structure, the inner portion thereof is supported by a truss and is made of photosensitive resin, and the bracket for pressure measuring steel pipes is integrally formed by 3D printing without additional obvious mass and stiffness to a model. Shapes of the upper surface and the lower surface of the bracket for pressure measuring steel pipes are the same as local airfoil profiles of the adjacent skin, and the bracket for pressure measuring steel pipes and the skin are completely fit to each other. The bracket for pressure measuring steel pipes is provided with pipe grooves for pressure measuring steel pipes for placing L-shaped pressure measuring steel pipes, semi-cylindrical convex structures are arranged at notches in the middle of the bracket for pressure measuring steel pipes and engaged with pressure measuring holes in the surface of the skin, the pressure measuring steel pipe extends out of the semi-cylindrical convex structure and is fixed by a holding block. A plurality of through holes are provided in the middle of the bracket for pressure measuring steel pipes and used for laying pressure measuring hoses inside the model. The device can effectively solve the problems that the pressure measuring steel pipe is not easy to install on the scale model for elastic similar structure of the wing and a required perpendicularity between a pipe axis of the pressure measuring steel pipe and the tangent plane of the skin surface is hard to reach, and thus reliability and effectiveness of the pressure measuring result of the wind tunnel test are ensured.

What is claimed is:

1. An aeroelastic scale model of a wing of a plane comprising skin, wing beams, and a pressure measuring device, the pressure measuring device further comprising: a bracket, pressure measuring hoses, holding blocks, and pressure measuring steel pipes, wherein an upper surface and a lower surface of the bracket are bonded to the skin and the wing beams by resin adhesive, each of the pressure measuring steel pipes is connected with a corresponding one of the pressure measuring hoses, each of the pressure measuring steel pipes is embedded into a corresponding one of pipe grooves in the bracket, and each of the pressure measuring steel pipes is fixed by a corresponding one of the holding blocks, and the pressure measuring steel pipes extends out of the skin; the bracket is provided with the pipe grooves for placing the pressure measuring steel pipes at required pressure measuring positions, and notches in the bracket for placing the holding blocks are formed at the pipe grooves in a middle part of the bracket; the upper surface and the lower surface of the bracket are provided with semi-cylindrical convex structures at the required pressure measuring positions, a height of each of the semi-cylindrical convex structures is the same as a thickness of the skin, and an inner diameter of each of the semi-cylindrical convex structures is equal to an outer diameter of each of the pressure measuring steel pipes; an outer wall of the bracket is a thin-walled structure with a thickness of 1 mm, an inner part of the bracket is supported by a truss structure, and a plurality of through holes are arranged in the middle part of the bracket to facilitate laying of the pressure measuring hoses in the wing; and an error of perpendicularity between an axis of each of the pressure measuring steel pipes and a tangent plane of a skin surface is smaller than 1.0 degree.

2. The aeroelastic scale model of a wing of a plane according to claim 1, wherein each of the holding blocks is arranged in a corresponding one of the notches and is in contact with an outer circumferential surface of a corresponding one of the pressure measuring steel pipes.

3. The aeroelastic scale model of a wing of a plane according to claim 1, wherein the bracket and the holding blocks are made of photosensitive resin.

* * * * *